United States Patent [19]

Jaecklin

[11] 4,343,014
[45] Aug. 3, 1982

[54] LIGHT-IGNITABLE THYRISTOR WITH ANODE-BASE DUCT PORTION EXTENDING ON CATHODE SURFACE BETWEEN THYRISTOR PORTIONS

[75] Inventor: Andre Jaecklin, Ennetbaden, Switzerland

[73] Assignee: BBC Brown, Boveri & Company, Limited, Baden, Switzerland

[21] Appl. No.: 243,146

[22] Filed: Mar. 12, 1981

Related U.S. Application Data

[63] Continuation of Ser. No. 91,829, Nov. 6, 1979, abandoned.

[30] Foreign Application Priority Data

Nov. 15, 1978 [CH] Switzerland ........................ 11725/78

[51] Int. Cl.³ ............................................. H01L 29/74
[52] U.S. Cl. ......................................... 357/38; 357/20; 357/30; 357/86
[58] Field of Search ........................ 357/38, 30, 86, 20

[56] References Cited

U.S. PATENT DOCUMENTS

| | | | |
|---|---|---|---|
| 3,832,732 | 8/1974 | Roberts | 357/38 LA |
| 4,142,201 | 2/1979 | Sittig et al. | 357/38 LA |
| 4,208,669 | 6/1980 | Silber et al. | 357/38 LA |

Primary Examiner—Joseph E. Clawson, Jr.
Attorney, Agent, or Firm—Oblon, Fisher, Spivak, McClelland & Maier

[57] ABSTRACT

A light-ignitable thyristor formed of a main thyristor and an auxiliary thyristor integrated on a common wafer, wherein in order to reduce the ignition ratio between the main and auxiliary thyristors, the length of the cathode emitter edge near the gate of the main thyristor is shortened by forming anode base zone ducts which reach up to the cathode side surface between portions of the main thyristor gate and cathode zones. The width of the anode base zone areas formed on the cathode surface side is selected such that during the entire ignition process, a narrow space charging zone acting as an insulation zone remains at least partially around the PN junction bordering the surface areas of the anode base zone.

7 Claims, 2 Drawing Figures

LIGHT-IGNITABLE THYRISTOR WITH ANODE-BASE DUCT PORTION EXTENDING ON CATHODE SURFACE BETWEEN THYRISTOR PORTIONS

This is a continuation of application Ser. No. 91,829, filed Nov. 6, 1979, now abandoned.

BACKGROUND OF THE INVENTION

1. Field of the Invention

This invention relates to a light-ignitable thyristor which consists of a main and an auxiliary thyristor (amplifying gate), integrated for ignition boosting, wherein the anode base zone of the light-ignitable thyristor reaches up to the surface on the cathode side in a narrow duct so that the PN junction formed by the anode base zone and the cathode base zone also borders directly the surface on the cathode side, and wherein the cathode zone of the auxiliary thyristor is surrounded by a ring-shaped gate zone of the main thyristor and in contact therewith.

2. Description of the Prior Art

Such light-ignitable thyristors as noted above are, for example, known from the German Pat. No. 24 08 079. In case of these known thyristors, the narrow duct of the anode base zone bordering the surface on the cathode side is arranged within a cathode zone of the auxiliary thyristor designed in the shape of a ring. This is followed towards the outside by the gate zone of the main thyristor, which contacts it, and both zones together are enclosed by the cathode zone of the main thyristor. When the surface on the cathode side is radiated by light, the auxiliary thyristor is firstly ignited which then effects the ignition of the main thyristor through the gate zone.

In the case of these known light-ignitable thyristors, the ignition sensitivity of the auxiliary thyristor is designed at as high a level as possible with a given dU/dt resistance which leads to a relatively small cathode zone. This results in a high ignition ratio Z without any special measures. In this context, the ratio $$Z = \frac{\text{minimum current required for the ignition of the main thyristor}}{\text{minimum current required for the ignition of the auxiliary thyristor}}$$

is called the ignition ratio. This ratio is about between 30 and 100 for light-ignitable thyristors with a high sensitivity to light. Therefore, a relatively large current must be supplied by the auxiliary thyristor for the ignition of the main thyristor which, with a high di/dt, can lead to the destruction of the auxiliary thyristor.

SUMMARY OF THE INVENTION

Accordingly, one object of this invention is to provide a novel light-ignitable thyristor with a high sensitivity to light of the type described above, in which the auxiliary thyristor is not subject to destruction under high loads, i.e. at a high di/dt.

This object, and other objects, are achieved according to the invention by providing a novel light-ignitable thyristor formed of a main thyristor and an auxiliary thyristor integrated with said main thyristor on a common semiconductor wafer for ignition boosting of said main thyristor, the integrated main and auxiliary thyristors each consisting of four zones of opposite conductivity type including a cathode zone facing a cathode side surface, a cathode base zone, a common anode base zone and a common anode zone facing an anode side surface, respectively, wherein the anode base zone reaches up to the cathode side surface in a narrow duct forming a duct PN junction with the cathode base zone on the side of the main thyristor cathode zone exposed to the cathode side surface, and the cathode zone of the auxiliary thyristor is surrounded by a gate zone of the main thyristor and in contact therewith, characterized by the fact that the narrow duct of the anode base zone has a cathode side surface area formed between the gate zone and the cathode zone of the main thyristor, and the cathode side surface area of the anode base zone duct has a width D selected such that a narrow space charge is at least partially maintained around the duct PN junction throughout the ignition of the main thyristor.

In a preferred embodiment, the ratio of $R/D \gg 1$ whereby R represents the curvature radius of the duct surface area formed by the anode base zone from the center of the ring-shaped main thyristor gate zone.

In a preferred embodiment the width D of the duct surface area side is $\leq 200$ μm.

In a preferred embodiment the anode base zone reaches up in at least two ducts to the cathode side surface, forming at least two corresponding cathode side surface areas.

This invention is, therefore, based on the realization that the auxiliary thyristor can be relieved by means of a sufficiently low ignition ratio. Since the ignition sensitivity of the auxiliary thyristor is to be maintained in order to keep as low as possible the strength of the light required for the ignition, the ignition sensitivity of the main thyristor must also be raised. This is effected by the special arrangement of the anode base zone on the surface of the cathode side. This is achieved owing to the fact that the raised PN junction produces, thanks to the space charging zone which is extended to the surface on the cathode side already with low blocking voltages, an effective insulation zone. This prevents then a flow of current at these points between auxiliary and main thyristors so that the gate current supplied by the auxiliary thyristor flows only there where there is no blocking transition between gate zone and cathode zone of the main thyristor. The length of the cathode zone edge on the gate side, which is effective for the ignition of the main thyristor, is thus reduced. The gate current density, which reaches this cathode zone edge, has, on the other hand, become higher so that the ignition sensitivity of the main thyristor increases.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
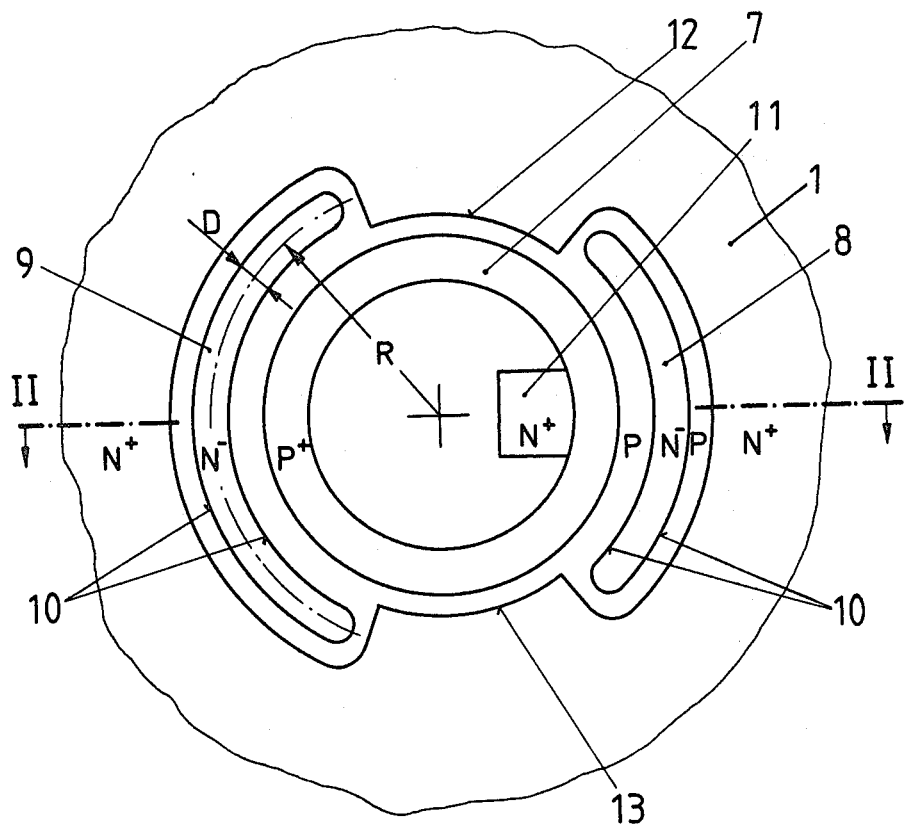
FIG. 1 is a top view showing a part of the surface on the cathode side of a thyristor according to the invention.

Referring now to the drawings, wherein like reference numerals designate identical or corresponding parts throughout the several views, the numeral designation 1 represents the cathode zone, 2 the cathode base zone, 3 the anode base zone, and 4 the anode zone. The cathode metallization 5 and the metallization 6 of the gate zone 7 are omitted in FIG. 1 in order to obtain a clearer representation.

Figure 2:
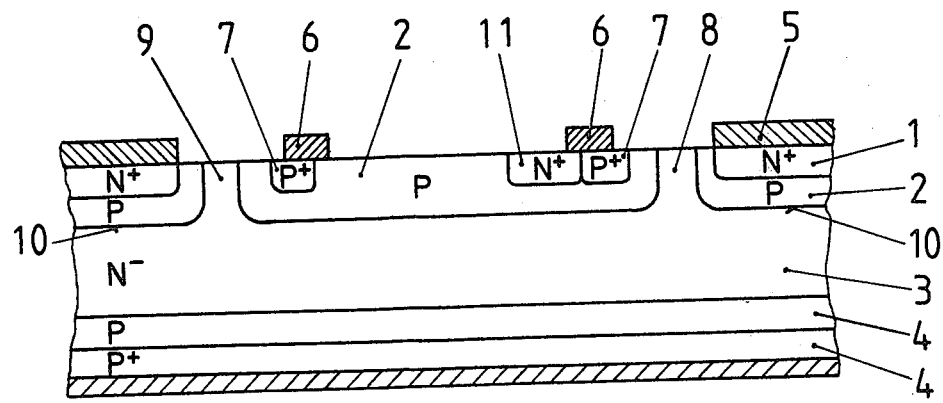
FIG. 2 is a schematic cross-sectional view of the thyristor of FIG. 1 taken along the line II—II.

As is shown in FIG. 2, the anode base zone 3 is led up to the surface on the cathode side through narrow ducts 8, 9 so that the PN junction 10 formed between the base zones borders also the cathode side surface. A space charging zone is formed around the PN junction 10 already with relatively low forward voltages. When this space charging zone is radiated by light, charge carriers are produced which are immediately separated by the electrical field existing in the space charging zone (see the German Pat. No. 24 08 097 cited in the introduction for the mode of operation, in principle, of the light-ignitable thyristor).

An ignition current is formed which stimulates the cathode zone 11 of the auxiliary thyristor to perform an injection and ignites this partial thyristor consisting of the zones 11, 2, 3 and 4. The auxiliary thyristor then supplies the gate current for the main thyristor and this gate current flows from the cathode zone 11 to the main thyristor gate zone 7 through the metallization 6 and from there to the cathode zone edges 12 and 13 (FIG. 1).

The width D of the raised ducts 8 and 9 must be such that, during the entire ignition process, at least a narrow space charging zone remains around the junction 10 ($0 < D \leq 200$ μm is generally applicable). Since the bend of the PN junctions reduces the blocking voltage which can be reached (cf. also: G. M. Sze, G. Gibbons, "Effect of Junction Curvature on Breakdown Voltages in Semiconductor", Solid State Electronics 9, p. 831 (1966)), the duct width D should also not be made too large. Furthermore, there must be applicable for the bend radius R (FIG. 1) $R >> D$.

As shown in FIGS. 1 and 2, the anode base zone 3 can also be connected with the surface on the cathode side through more than 2 ducts. The use of only one duct is also possible.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A light-ignitable thyristor formed of a main thyristor and an auxiliary thyristor integrated with said main thyristor on a common semiconductor wafer for ignition boosting of said main thyristor, said integrated main and auxiliary thyristors each consisting of four zones of opposite conductivity type including a cathode zone facing a cathode side surface, a cathode base zone, a common anode base zone and a common anode zone facing an anode side surface, respectively, wherein the anode base zone reaches up to the cathode side surface in a narrow duct forming a duct PN junction with said cathode base zone on the side of the main thyristor cathode zone exposed to the cathode side surface, and the cathode zone of said auxiliary thyristor is surrounded by a gate zone of the main thyristor and in contact therewith, comprising:

said gate zone being of the same conductivity type as said cathode base zone but more heavily doped than the latter;

means for concentrating current from said gate zone to said cathode zone to raise the ignition sensitivity of said main thyristor, comprising said narrow duct of said anode base zone having a cathode side surface area formed between the gate zone and the cathode zone of the main thyristor; and said cathode side surface area of said anode base zone duct having a width D selected such that a narrow space charge zone is at least partially maintained around the duct PN junction throughout the ignition of said main thyristor.

2. A light-ignitable thyristor according to claim 1 further comprising:

said gate zone of said main thyristor having a ring shape defining a center; and the average distance R from the cathode side surface area of said duct to the center of said ring-shaped gate zone bearing the relationship $(R/D) >> 1$.

3. A light-ignitable thyristor according to claims 1 or 2, further comprising:

the width D of the cathode side surface area of said duct being $\leq 200$ μm.

4. A light ignitable thyristor according to claims 1 or 2, further comprising:

at least two anode base zone ducts forming at least two corresponding cathode side surface areas.

5. A light-ignitable thyristor according to claim 3, further comprising:

at least two anode base zone ducts forming at least two corresponding cathode side surface areas.

6. A light-ignitable thyristor according to claim 1 further comprising:

said narrow duct of said anode base zone having a width D and a lateral, bent shape with at least one radius of curvature bearing the relationship $(R/D) >> 1$.

7. A light-ignitable thyristor according to claim 1 wherein said gate zone of said main thyristor has a ring shape and said anode base zone reaching up to the cathode side surface to form said narrow duct has a shape that conforms to the circular shape of said gate zone; said narrow duct encircling only a portion of said gate zone.

* * * * *